US012810938B2

(12) United States Patent
Huang et al.

(10) Patent No.: US 12,810,938 B2
(45) Date of Patent: Nov. 24, 2026

(54) MEMORY DEVICE AND PROGRAMMING METHOD THEREOF

(71) Applicant: MACRONIX International Co., Ltd., Hsinchu (TW)

(72) Inventors: Shih-Chang Huang, Penghu County (TW); Zhao-Xuan Lin, Changhua County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 99 days.

(21) Appl. No.: 19/023,299

(22) Filed: Jan. 16, 2025

(65) Prior Publication Data

US 2026/0204319 A1 Jul. 16, 2026

(51) Int. Cl.

*G11C 16/08* (2006.01)
*G11C 16/10* (2006.01)
*G11C 16/34* (2006.01)
*G11C 16/04* (2006.01)

(52) U.S. Cl.

CPC .......... *G11C 16/10* (2013.01); *G11C 16/3459* (2013.01); *G11C 16/0483* (2013.01); *G11C 16/08* (2013.01)

(58) Field of Classification Search

CPC . G11C 16/10; G11C 16/3459; G11C 16/0483; G11C 16/08

See application file for complete search history.

(56) References Cited

U.S. PATENT DOCUMENTS

2009/0225600 A1* 9/2009 Park .................... G11C 11/5628 365/185.11
2012/0020161 A1* 1/2012 Haukness ........... G06F 12/0246 365/189.16
2013/0163335 A1* 6/2013 Kim .................. G11C 16/3436 365/185.12
2018/0286488 A1* 10/2018 Sanasi .................... G11C 16/26
2019/0088336 A1 3/2019 Lin et al.
2020/0234786 A1 7/2020 Hsiao (Continued)

FOREIGN PATENT DOCUMENTS

CN 113051100 A 6/2021
TW I498911 B 9/2015

(Continued)

OTHER PUBLICATIONS

Office Action of Taiwan Counterpart Application, issued on Oct. 15, 2025, p. 1-p. 3.

*Primary Examiner* — Mushfique Siddique
(74) *Attorney, Agent, or Firm* — J.C. PATENTS

(57) ABSTRACT

A memory device and a programming method thereof are provided. The memory device is, for example, a three dimensional NAND flash memory circuit, and provides a storage media with high-performance and high-capacity. The programming method includes: after a first program operation on a plurality of memory planes of the memory device, performing a program verify operation on each of the memory planes; performing a second program operation on each of the memory planes of the memory device, and performing an error bit count detection operation accompanying the second program operation to determine at least one verified plane of the memory planes; and disabling accessing operation on the at least one verified plane.

14 Claims, 4 Drawing Sheets

(56) References Cited

U.S. PATENT DOCUMENTS

| | | | | |
|---|---|---|---|---|
| 2021/0264994 A1* | 8/2021 | Deng | ..................... | G11C 5/025 |
| 2021/0391014 A1* | 12/2021 | Li | ........................... | G11C 16/08 |
| 2022/0319571 A1* | 10/2022 | Guo | ....................... | G11C 5/145 |
| 2023/0023618 A1* | 1/2023 | Zhang | .................... | G11C 16/30 |
| 2023/0143677 A1* | 5/2023 | Jiang | ...................... | G11C 16/10 |
| | | | | 365/189.011 |

FOREIGN PATENT DOCUMENTS

| | | |
|---|---|---|
| TW | 202001915 A | 1/2020 |
| TW | 202018718 A | 5/2020 |
| TW | 202032567 A | 9/2020 |

* cited by examiner

MEMORY DEVICE AND PROGRAMMING METHOD THEREOF

BACKGROUND

Technical Field

The disclosure relates to a memory device and a programming method thereof, and more particularly, to a memory device and a programming method thereof that may reduce cross interference between memory planes in a programming process.

Description of Related Art

In order to improve data writing efficiency of a memory device, a multi-plane memory device is provided. In such a memory device with multiple memory planes, when a program operation is performed on the memory planes, in the conventional technical field, a single control circuit may be used to perform the program operation on all the memory planes. In this way, due to differences in electrical characteristics between the memory planes, programming of some memory planes may be completed and verified relatively early. However, in the memory device in the conventional technical field, the program operation is required to be continuously performed on all the memory planes until programming of all the memory planes is completed and verified. As a result, the memory plane that completed the program verification operation relatively early will still be applied with a bias voltage of the program operation after passing the program verification, causing interference to characteristics of memory cells therein.

SUMMARY

The disclosure provides a memory device and a programming method thereof, which may reduce interference caused by different completion rates of program operations in a memory plane.

A programming method in the disclosure includes the following. After a first program operation on multiple memory planes of the memory device, a program verification operation is performed on each of the memory planes of the memory device. A second program operation is performed on each of the memory planes of the memory device, and a failure bit count detection operation is performed accompanying the second program operation to determine at least one verified memory plane of the memory planes. An accessing operation on the at least one verified memory plane is disabled.

A memory device in the disclosure includes multiple memory planes and a control circuit. The control circuit is coupled to the memory planes. The control circuit is used to, after a first program operation on multiple memory planes of the memory device, perform a program verification operation on each of the memory planes of the memory device; perform a second program operation on each of the memory planes of the memory device, and perform a failure bit count detection operation accompanying the second program operation to determine at least one verified memory plane of the memory planes; and disable an accessing operation on the at least one verified memory plane.

Based on the above, in the embodiment of the disclosure, after the first program operation and the corresponding program verification operation in the memory device, the subsequent program operation is accompanied by the failure bit count detection operation. Through the failure bit count detection operation, one or more verified memory planes of the memory planes may be first determined, and after the verified memory plane is determined, the verified memory plane is turned off, and no accessing operations will be performed on the verified memory plane in the subsequent program operation. In this way, the quickly verified memory plane may avoid interference caused by the subsequent program operation and maintain stability of the programmed memory plane.

DETAILED DESCRIPTION OF DISCLOSED EMBODIMENTS

Figure 1:
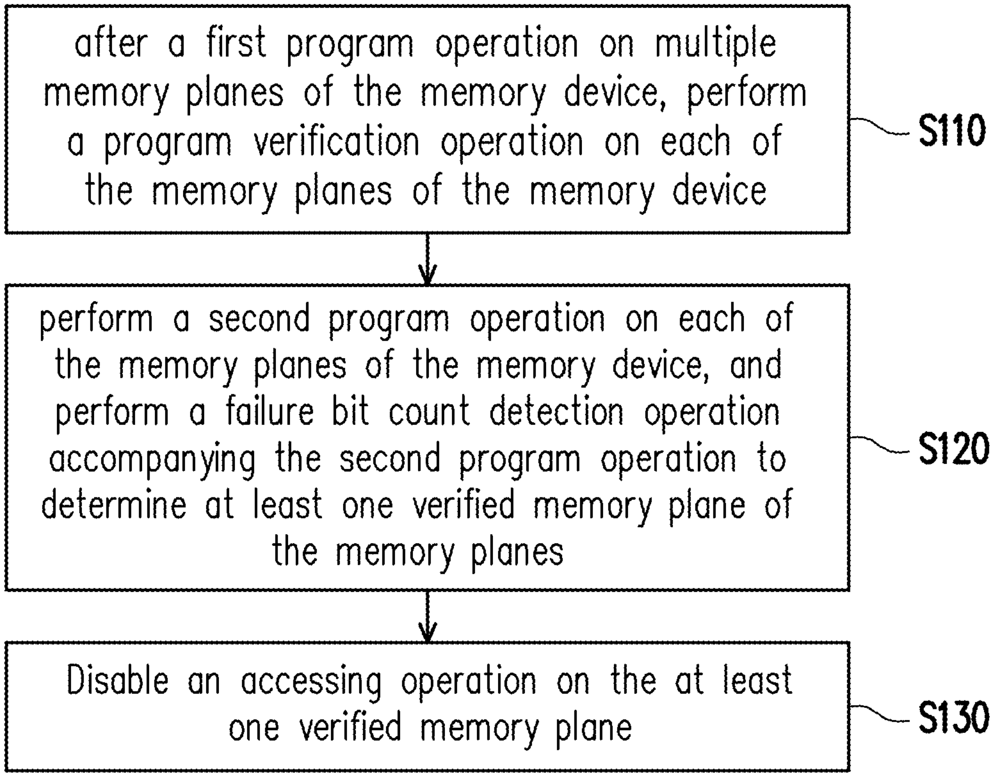
FIG. 1 is a flow chart of a programming method of a memory device according to an embodiment of the disclosure.

Referring to FIG. 1, FIG. 1 is a flow chart of a programming method of a memory device according to an embodiment of the disclosure. The memory device has multiple memory planes. In step S110, a first program operation is performed on the memory planes of the memory device. After the first program operation, a program verification operation is performed on each of the memory planes of the memory device. Next, in step S120, a second program operation is performed on the memory planes that have failed the verification, and in the second program operation, an accompanying failure bit count detection operation is performed on the memory planes, and it is detected whether the memory planes have one or more verified memory planes through the failure bit count detection operation. In detail, the failure bit count detection (FBD) operation is used to detect the number of unprogrammed memory cells in the memory plane, which is a so-called failure bit count. When the number of detected failure bits in the detected memory plane is lower than a preset threshold, the detected memory plane may be set as a verified memory plane.

In step S130, an accessing operation on at least one verified memory plane determined in step S120 is disabled. At the same time, if there are one or more unverified memory planes, the subsequent program operation and failure bit count detection operation will be performed on the unverified memory planes. Therefore, by causing the at least one verified memory plane to be turned off, the subsequent program operation and failure bit count detection operation will not interfere with the at least one verified memory plane, and may maintain electrical characteristics of the memory cells on the at least one verified memory plane in a stable programmed state, so that excessive programming will not occur.

Furthermore, in the embodiment of the disclosure, by turning off the at least one verified memory plane, the number of memory planes targeted by the subsequent program operation and failure bit count detection operation may also be reduced, which may effectively reduce required power consumption and achieve an effect of energy saving and carbon reduction.

Figure 2:
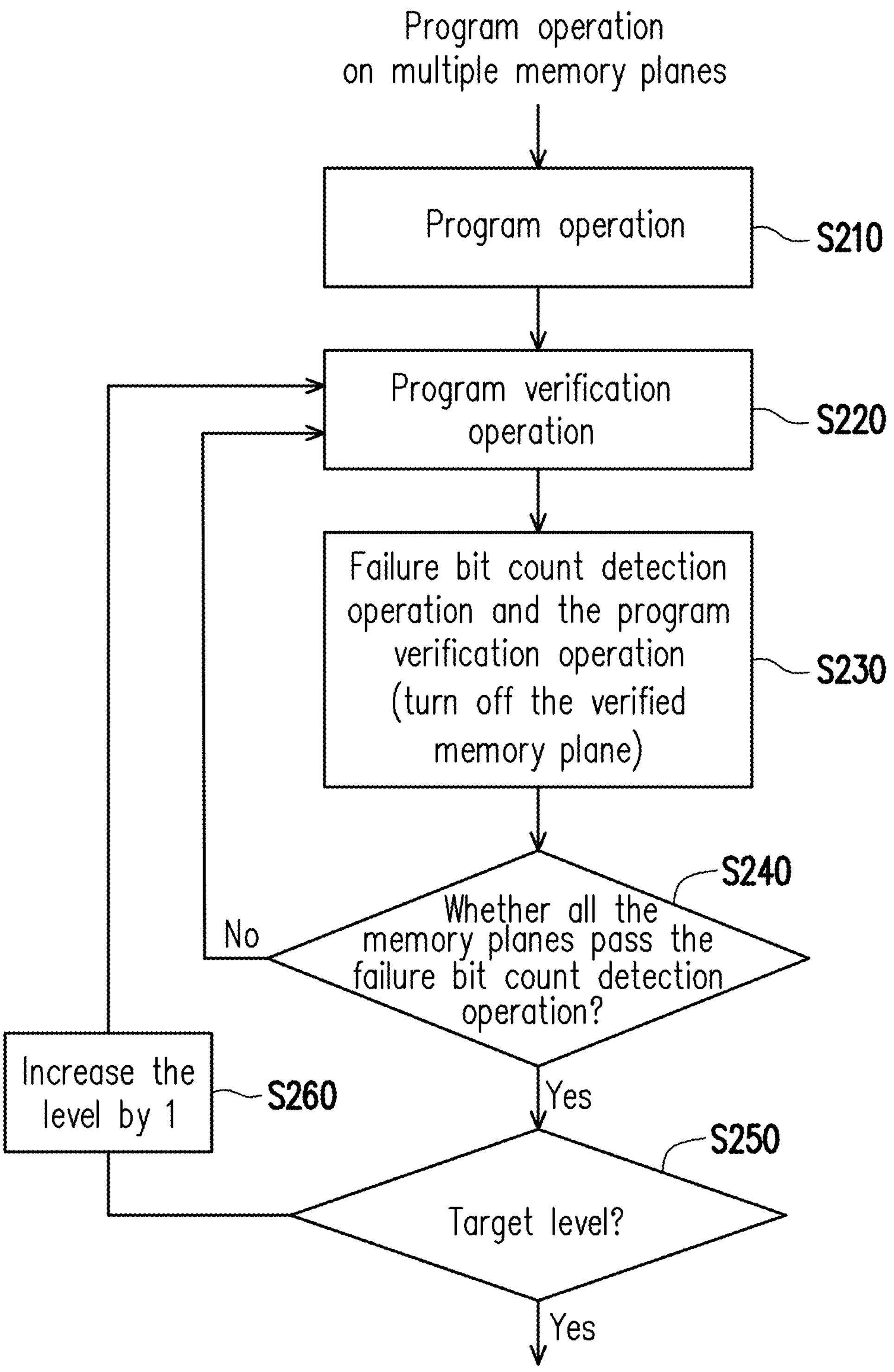
FIG. 2 is a flow chart of a programming method of a memory device according to another embodiment of the disclosure.

Referring to FIG. 2, FIG. 2 is a flow chart of a programming method of a memory device according to another embodiment of the disclosure. FIG. 2 is a flow chart of the program operation on the memory planes of the memory device having the memory planes. In step S210, the first program operation is performed on the memory planes. Next, in step S220, the program verification operation is performed corresponding to the program operation in step S210, thereby verifying the programmed state of each of the memory planes. It is worth mentioning that in this embodiment, the program verification operation may be performed on multiple levels where a critical voltage of each of the memory cells is located. In other words, the memory cells in the memory device may be flash memory cells of a multi-level storage unit. Furthermore, step S220 may be the program verification operation performed on each of the memory planes corresponding to one of the levels.

In step S230, the accompanying failure bit count detection operation and the program verification operation corresponding to the program operation in step S210 are executed together with each other. In the failure bit count detection operation and the program verification operation, if it is determined that there is a verified memory plane, the verified memory plane may be turned off accordingly. In detail, corresponding to each of the memory planes, when verification results of the failure bit count detection operation from a first level to a target level are all verified, each of the detected memory planes may be the verified memory plane.

On the other hand, in step S230, the verified memory plane may be masked to isolate and not receive relevant signals from the subsequent program operation, program verification operation, and failure bit count detection operation.

In step S240, it is determined whether all the memory planes pass the failure bit count detection operation. If a determination result in step S240 is yes, step S250 may be performed. On the other hand, if the determination result is no, it is required to return to step S220.

In step S250, it may be determined whether the failure bit count detection operation performed in step S230 corresponds to a target level in a storage level of the memory cell. If the determination result in step S250 is yes, the current program operation on the memory planes may be ended. On the contrary, if the determination result in step S250 is no, the level corresponding to the failure bit count detection operation may be increased by 1, and step S220 may be performed again to perform the failure bit count detection operation on the next level.

Here, please note that the target level in step S250 may be, for example, the last level among in the storage level of the memory cell. For example, if the storage level of the memory cell are a level A to a level G respectively, the level A to the level G respectively correspond to multiple critical voltage ranges that increase in sequence. The level G may be the last level (the highest level) in the storage level. The target level in this embodiment may be any one of the level A to the level G, which may be set by an engineering without certain restrictions.

In addition, a level increment operation in step S260 may increase the failure bit count detection operation from the level corresponding to the relatively low critical voltage range to the level corresponding to the higher critical voltage range, for example, changing from corresponding to the level A to the level B, or changing from the level B to the level C.

Incidentally, the above target level may also be a combination of the levels. When the failure bit count detection operations on each of the memory planes set as the target levels all pass, each of the memory planes may be set as the verified memory plane.

In addition, in other embodiments of the disclosure, after determining that one or more memory planes among the memory planes are verified memory planes, the memory device may provide multiple program pulse waves to the above-verified memory planes, and then perform a turn-off operation on the verified memory planes, so as to ensure that the program operation on the verified memory planes has been completed.

Figure 3:
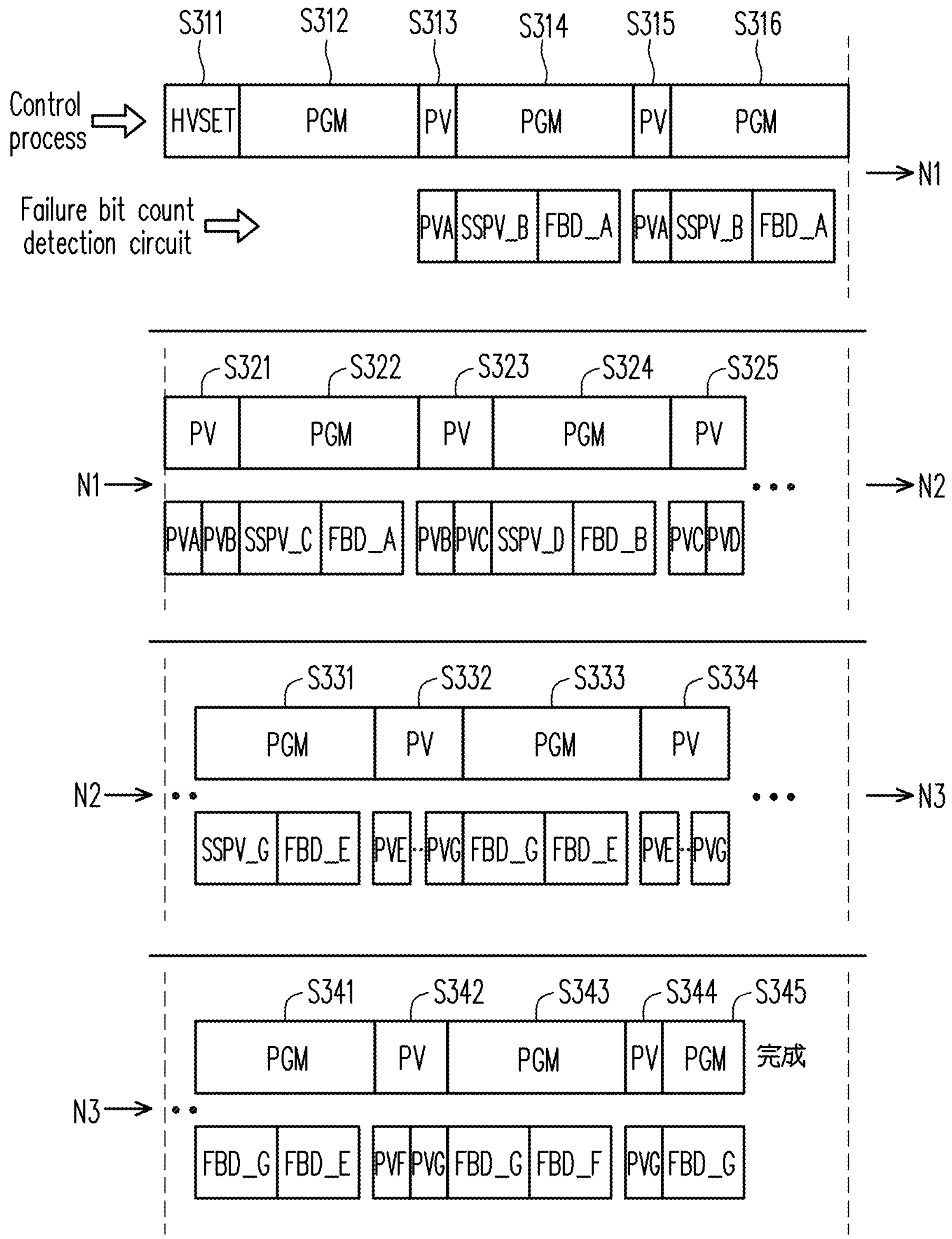
FIG. 3 is a flow chart of implementation details of a programming method of a memory device according to an embodiment of the disclosure.

Referring FIG. 3, which is a flow chart of implementation details of a programming method of a memory device according to an embodiment of the disclosure. In FIG. 3, a controller of the memory device may perform a control process, and a failure bit count detection circuit therein may perform the corresponding failure bit count detection operation corresponding to the control process. The memory device may have the memory planes.

Step S311 is a high voltage setting process HVSET in the memory device, and the subsequent step S312 is a program operation process PGM. Step S313 is a program verification operation process PV. Correspondingly, the failure bit count detection circuit may be synchronized in step S313 to perform the program verification operation corresponding to the level A.

Next, step S314 is another program operation process PGM, and the failure bit count detection circuit correspondingly performs a smart skip program verification operation SSPV_B corresponding to the level B and a failure bit count detection operation FBD_A corresponding to the level A. Here, taking the smart skip program verification operation SSPV_B of the level B corresponding to step S314 and the failure bit count detection operation FBD_A of the level A that are both failed as an example, in step S315, the next program verification operation process PV is entered, and in step S316, the program operation process PGM is performed again.

Corresponding to step S315, the failure bit count detection circuit may perform a program verification operation PVA corresponding to the level A again. Corresponding to step S316, the failure bit count detection circuit may perform the smart skip program verification operation SSPV_B corresponding to the level B and the failure bit count detection operation FBD_A corresponding to the level A again. A verification result of the smart skip program verification operation SSPV_B corresponding to the level B in step S316 is, for example, passed, and the failure bit count detection operation FBD_A corresponding to the level A is, for example, failed.

After completing step S316, the process may enter a node N1.

Continuing from the node N1, in step S321, the control process is a program verification operation process. Corresponding to step S321, the failure bit count detection circuit may perform program verification operations PVA and PVB corresponding to the levels A and B respectively. In step S322, the control process is the program operation process PGM, and the failure bit count detection circuit may perform a smart skip program verification operation SSPV_C corresponding to the level C and the failure bit count detection operation FBD_A corresponding to the level A. In this embodiment, the smart skip program verification operation SSPV_C corresponding to the level C and the failure bit count detection operation FBD_A corresponding to the level A are both passed, for example.

Steps S323 and S325 are the program verification operation processes PV, and step S324 is the program operation process PGM. Corresponding to step S323, the failure bit count detection circuit may perform program verification operations PVB and PVC corresponding to the levels B and C respectively. Corresponding to step S324, the failure bit count detection circuit may perform a smart skip program verification operation SSPV_D corresponding to the level D and a failure bit count detection operation FBD_B corresponding to the level B. In this embodiment, the smart skip program verification operation SSPV_D and the failure bit count detection operation FBD_B are both passed, for example. Corresponding to step S325, the failure bit count detection circuit may perform program verification operations PVC and PVD corresponding to the levels C and D respectively.

After step S325, the program operation process and the program verification operation process may be performed alternately one or more times, and a node N2 is entered.

Continuing from the node N2, in steps S331 to S334 the program operation process PGM, the program verification operation process PV, the program operation process PGM, and the program verification operation process PV may be performed in sequence respectively. Corresponding to step S331, the failure bit count detection circuit may perform a smart skip program verification operation SSPV_G corresponding to the level G and a failure bit count detection operation FBD_E corresponding to the level E. Here, the smart skip program verification operation SSPV_G that is passed and the failure bit count detection operation FBD_E that is failed are taken as an example. Then, corresponding to step S332, the failure bit count detection circuit may perform program verification operations PVE to PVG corresponding to the levels E to G. Corresponding to step S333, the failure bit count detection circuit may perform failure bit count detection operations FBD_G and FBD_E corresponding to the levels G and E respectively.

Here, taking the target level set to the level G as an example, among detection results of the failure bit count detection operation FBD_G corresponding to step S333, the detection results of some of the memory planes are passed, and the detection results of another of the memory planes are failed. Here, the corresponding memory plane whose detection result is passed may be turned off accordingly to stop access.

In addition, in this embodiment, the failure bit count detection operation FBD_E is failed, for example.

Then, corresponding to step S334, the failure bit count detection circuit may perform the program verification operations PVE to PVG of the levels E to G on the memory plane that has not been turned off.

Similarly, in step S334, the program operation process and the program verification operation process may be performed alternately one or more times, and a node N3 is entered.

Continuing from the node N3, in steps S341 to S345, the program operation process PGM, the program verification operation process PV, the program operation process PGM, the program verification operation process PV, and the program operation process PGM may be performed in sequence respectively. Corresponding to step S341, the failure bit count detection circuit may perform the failure bit count detection operations FBD_G and FBD_E corresponding to the levels G and E respectively. Here, it is taken as an example that the detection results of the failure bit count detection operation FBD_G of another of the memory planes are passed, and the detection results of the failure bit count detection operation FBD_G of the remaining ones are still failed. The detection results of the failure bit count detection operation FBD_E are all passed.

Similarly, corresponding to step S341, the memory plane in which the failure bit count detection operation FBD_G is passed may be turned off to stop access.

Corresponding to step S342, the failure bit count detection circuit may perform program verification operations PVF and PVG corresponding to the levels F and G. Corresponding to step S343, the failure bit count detection circuit may perform failure bit count detection operations FBD_G and FBD_F respectively corresponding to the levels G and F. Here, the detection results of the failure bit count detection operation FBD_F that are all passed are taken as an example. Among the detection results of the failure bit count detection operation FBD_G, the detection results of some of the memory planes are passed. Some of the memory planes that pass the detection may also be turned off.

Corresponding to step S344, the failure bit count detection circuit may perform the program verification operation PVG corresponding to the level G, and corresponding to step S345, program the failure bit count detection operation FBD_G. The detection results of the remaining memory planes on which the failure bit count detection operation FBD_G is performed this time are all passed. Accordingly, the program operation process may be completed.

Of course, the corresponding detection results in the above operation process are only examples for illustration. The illustration in FIG. 3 is only used to enable those with ordinary knowledge in the art to understand the operational details in the embodiment of the disclosure, and it does not mean that in all the program operations, whether the failure bit count detection result passes or fails will be consistent with the above description.

Figure 4:
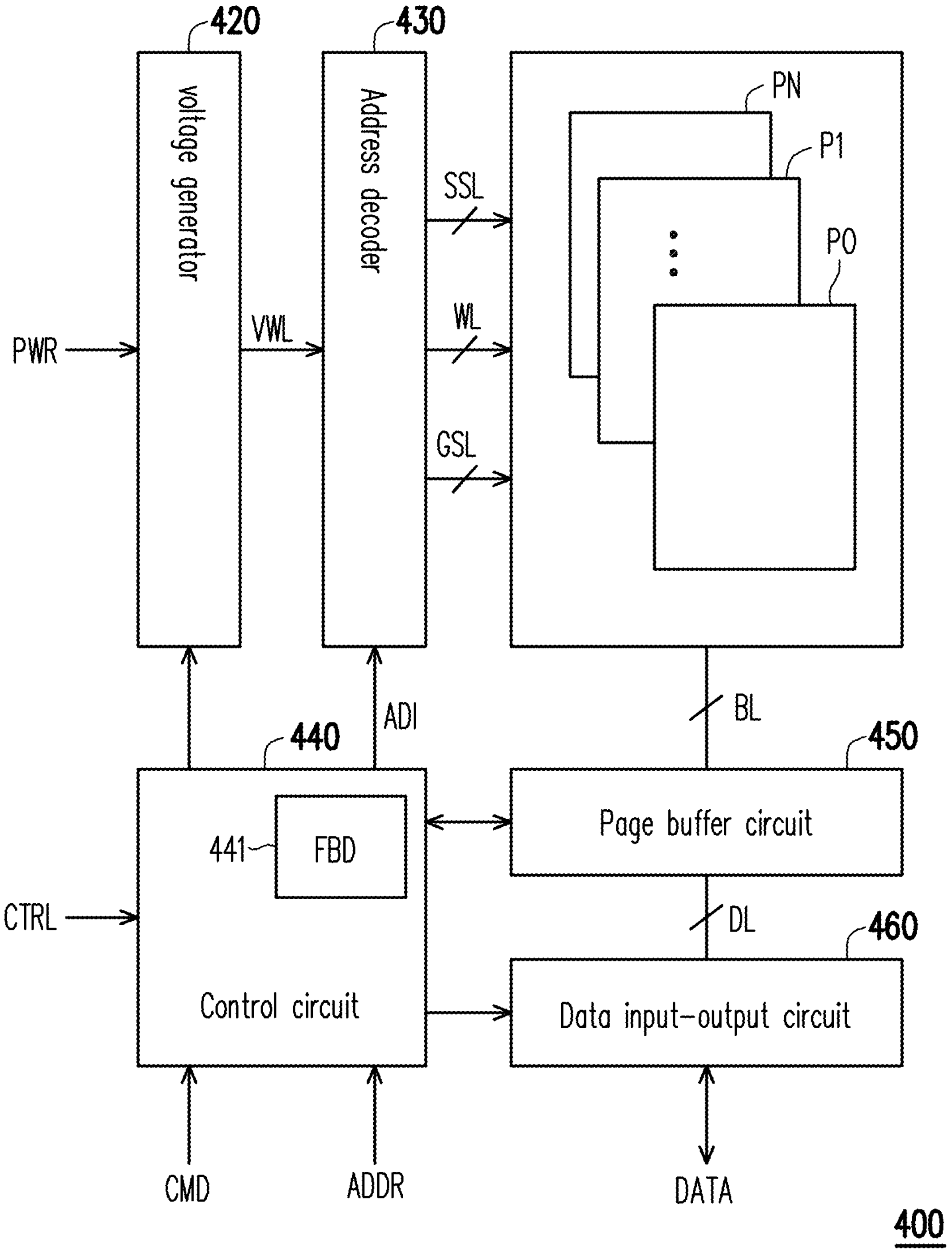
FIG. 4 is a schematic view of a memory device according to an embodiment of the disclosure.

Referring to FIG. 4, FIG. 4 is a schematic view of a memory device according to an embodiment of the disclosure. A memory device 400 includes multiple memory planes P0 to PN, a voltage generator 420, an address decoder 430, a control circuit 440, a page buffer circuit 450, and a data input-output circuit 460. The voltage generator 420 receives a power source PWR, and is used to provide a word line voltage VWL to the address decoder 430 according to the power source PWR. The control circuit 440 receives a control signal CTRL, a command signal CMD, and an address signal ADDR. The control circuit 440 provides access position information ADI to the address decoder 430 according to the address signal ADDR. The address decoder 430 may generate and provide a selection signal SSL, a word line signal WL, and a ground selection line signal GSL to the memory planes P0 to PN according to the access position information ADI.

The page buffer circuit 450 is coupled to bit lines of the memory planes P0 to PN to receive or transmit a bit line signal BL. The page buffer circuit 450 may generate data DL for reading data by sensing the bit line signal BL, or generate the bit line signal BL according to the data DL for writing data. The data DL for reading the data may be received by the data input-output circuit 460 and generated as output data DATA. In addition, the data DL for writing the data may be generated according to the input data DATA provided by the data input-output circuit 460.

It is worth noting that in this embodiment, the control circuit 440 includes a failure bit count detection circuit (FBD) 441. The failure bit count detection circuit (FBD) 441 may be a digital circuit, and may be used to perform the failure bit count detection operation.

A process of the program operation performed by the control circuit 440 has been described in detail in the foregoing embodiments in FIG. 1 to FIG. 3. Therefore, the same details will not be repeated in the following.

Based on the above, the memory device in the disclosure detects each of the memory planes by performing the failure bit count detection operation during the program operation process. In addition, when the memory plane is the verified memory plane, by turning off this memory plane, the memory device may prevent the verified memory plane from being interfered by the subsequent program operation and maintain stability of the stored data of the memory cells of the verified memory plane.

What is claimed is:

1. A programming method of a memory device, comprising:

after a first program operation on a plurality of memory planes of the memory device, performing a program verification operation on each of the memory planes of the memory device;

performing a second program operation on each of the memory planes of the memory device, and performing a failure bit count detection operation accompanying the second program operation to determine at least one verified memory plane of the memory planes;

disabling an accessing operation on the at least one verified memory plane, wherein when a verification result corresponding to the failure bit count detection operation for a target level is passed, each of the corresponding memory planes is each of the verified memory planes; and between the program verification operation corresponding to a first level and the failure bit count detection operation corresponding to the first level, performing, by a failure bit count detection circuit, a smart skip program verification operation corresponding to a second level.

2. The programming method according to claim 1, wherein the smart skip program verification operation corresponding to the second level and the second program operation are performed synchronously.

3. The programming method according to claim 1, further comprising:

when a verification result of the smart skip program verification operation corresponding to the second level is passed, initiating the program verification operation corresponding to the second level.

4. The programming method according to claim 1, further comprising;

corresponding to the memory planes, when a verification result of the failure bit count detection operation on the first level to the target level is passed, completing the programming method.

5. The programming method according to claim 1, wherein the target level is selected from a range from the first level to a highest level.

6. The programming method according to claim 1, wherein when a verification result of the failure bit count detection operations corresponding to multiple levels is passed, each of the corresponding memory planes is each of the verified memory planes.

7. The programming method according to claim 1, further comprising:

after determining that the at least one verified memory plane of the memory planes, providing a plurality of program pulse waves to the at least one verified memory plane, and then turning off the at least one verified memory plane.

8. A memory device, comprising:

a plurality of memory planes; and a control circuit coupled to the memory planes, wherein the control circuit is used to:

after a first program operation on a plurality of memory planes of the memory device, perform a program verification operation on each of the memory planes of the memory device;

perform a second program operation on each of the memory planes of the memory device, and perform a failure bit count detection operation accompanying the second program operation to determine at least one verified memory plane of the memory planes; and disable an accessing operation on the at least one verified memory plane, wherein the control circuit is further used to:

when a verification result corresponding to the failure bit count detection operation for a target level is passed, enable each of the corresponding memory planes to be each of the verified memory planes; and between the program verification operation corresponding to a first level and the failure bit count detection operation corresponding to the first level, perform, by a failure bit count detection circuit, a smart skip program verification operation corresponding to a second level.

9. The memory device according to claim 8, wherein the control circuit is further used to:

performed the smart skip program verification operation corresponding to the second level and the second program operation synchronously.

10. The memory device according to claim 8, wherein the control circuit is further used to:

when a verification result of the smart skip program verification operation corresponding to the second level is passed, initiate the program verification operation corresponding to the second level.

11. The memory device according to claim 8, wherein the control circuit is further used to:

select the target level from a range from the first level to a highest level.

12. The memory device according to claim 8, wherein the control circuit is further used to:

when verification results of the failure bit count detection operations corresponding to multiple target levels are all passed, enable each of the corresponding memory planes to be each of the verified memory planes.

13. The memory device according to claim 8, wherein the control circuit comprises:

the failure bit count detection circuit used to perform the failure bit count detection operation.

14. The memory device according to claim 8, further comprising:

a voltage generator coupled to the control circuit to provide a word line voltage;

an address decoder coupled between the voltage generator and the memory planes to generate a plurality of address signals;

a page buffer circuit coupled to the control circuit and coupled to a plurality of bit lines of the memory planes; and a data input-output circuit coupled between a page buffer and the control circuit.

* * * * *